United States Patent
Antoniswamy et al.

(10) Patent No.: US 10,763,188 B2
(45) Date of Patent: Sep. 1, 2020

(54) INTEGRATED HEAT SPREADER HAVING ELECTROMAGNETICALLY-FORMED FEATURES

(71) Applicant: Intel Corporation, Santa Clara, CA (US)

(72) Inventors: Aravindha R. Antoniswamy, Phoenix, AZ (US); Thomas John Fitzgerald, Phoenix, AZ (US); Kumaran Murugesan Chakravarthy, Chandler, AZ (US); Syadwad Jain, Chandler, AZ (US); Wei Hu, Chandler, AZ (US); Zhizhong Tang, Tempe, AZ (US)

(73) Assignee: Intel Corporation, Santa Clara, CA (US)

( * ) Notice: Subject to any disclaimer, the term of this patent is extended or adjusted under 35 U.S.C. 154(b) by 980 days.

(21) Appl. No.: 14/998,122

(22) Filed: Dec. 23, 2015

(65) Prior Publication Data

US 2017/0186628 A1 Jun. 29, 2017

(51) Int. Cl.
*H01L 23/373* (2006.01)
*H01L 21/48* (2006.01)
*H01L 23/367* (2006.01)
*H01L 23/00* (2006.01)

(52) U.S. Cl.
CPC ...... *H01L 23/3736* (2013.01); *H01L 21/4878* (2013.01); *H01L 23/3675* (2013.01); *H01L 24/16* (2013.01); *H01L 24/29* (2013.01); *H01L 24/32* (2013.01); *H01L 24/73* (2013.01); *H01L 2224/16227* (2013.01); *H01L 2224/29298* (2013.01); *H01L 2224/32245* (2013.01); *H01L 2224/73253* (2013.01); *H01L 2924/10253* (2013.01); *H01L 2924/1432* (2013.01); *H01L 2924/1433* (2013.01); *H01L 2924/1434* (2013.01); *H01L 2924/15311* (2013.01);
(Continued)

(58) Field of Classification Search
CPC . H01L 23/367; H01L 23/373; H01L 23/3736; F28F 21/08; F28F 21/085; F28F 21/089
USPC ............ 165/185; 361/679.01, 688, 689, 701, 361/702, 704, 722
See application file for complete search history.

(56) References Cited

U.S. PATENT DOCUMENTS 6,139,975 A * 10/2000 Mawatari .................. B22F 5/00
257/E23.102
7,239,517 B2 * 7/2007 Fitzgerald ............... H01L 23/04
257/706
(Continued)

OTHER PUBLICATIONS

Iugaza Dislocations and Strengthening Mechanisms, Chapter 7 http://site.iugaza.edu.ps/jelzebda/files/2010/02/Chapter07Call.pdf (Year: 2010).*

*Primary Examiner* — Keith M Raymond
*Assistant Examiner* — Gustavo A Hincapie Serna
(74) *Attorney, Agent, or Firm* — Schwabe, Williamson & Wyatt, P.C.

(57) ABSTRACT

Integrated heat spreaders having electromagnetically-formed features, and semiconductor packages incorporating such integrated heat spreaders, are described. In an example, an integrated heat spreader includes a top plate flattened using an electromagnetic forming process. Methods of manufacturing integrated heat spreaders having electromagnetically-formed features are also described.

4 Claims, 12 Drawing Sheets

(52) U.S. Cl.
CPC ............... *H01L 2924/16153* (2013.01); *H01L 2924/16172* (2013.01); *H01L 2924/16251* (2013.01)

(56) References Cited

U.S. PATENT DOCUMENTS

| | | | | |
|---|---|---|---|---|
| 7,364,063 B2* | 4/2008 | Schaenzer | | B23K 35/02 228/179.1 |
| 8,350,263 B2* | 1/2013 | Oda | | G01R 31/2884 257/48 |
| 9,666,669 B1* | 5/2017 | Balakrishnan | | H01L 29/165 |
| 2002/0053665 A1* | 5/2002 | Tsuda | | G11B 7/127 257/14 |
| 2003/0090875 A1* | 5/2003 | Fitzgerald | | H01L 23/3675 361/708 |
| 2004/0048471 A1* | 3/2004 | Okagawa | | H01L 21/02433 438/689 |
| 2005/0285258 A1* | 12/2005 | Chen | | H01L 21/565 257/706 |
| 2006/0063306 A1* | 3/2006 | Choi | | H01L 23/3128 438/110 |
| 2007/0210438 A1* | 9/2007 | Briere | | H01L 23/3107 257/690 |
| 2008/0185713 A1* | 8/2008 | Dani | | H01L 23/10 257/713 |
| 2009/0286382 A1* | 11/2009 | Huff | | C23F 4/00 438/455 |
| 2010/0314717 A1* | 12/2010 | Sakai | | H01L 21/0254 257/615 |
| 2011/0006368 A1* | 1/2011 | Hata | | H01L 21/02381 257/347 |
| 2011/0076791 A1* | 3/2011 | Wu | | H01L 33/007 438/31 |
| 2012/0189030 A1* | 7/2012 | Miyoshi | | H01S 5/3013 372/45.012 |
| 2013/0176679 A1* | 7/2013 | Anderl | | H01L 23/4093 361/679.47 |
| 2013/0213630 A1* | 8/2013 | Southard, II | | B32B 18/00 165/185 |
| 2014/0309923 A1* | 10/2014 | Ricci | | G06F 3/0482 701/400 |
| 2014/0327013 A1* | 11/2014 | Schenk | | C30B 25/183 257/76 |

* cited by examiner

A - A

B - B

INTEGRATED HEAT SPREADER HAVING ELECTROMAGNETICALLY-FORMED FEATURES

TECHNICAL FIELD

Embodiments of the invention are in the field of semiconductor packages and, in particular, semiconductor packages including integrated heat spreaders having plastically deformed features.

BACKGROUND

Semiconductor packages are used for protecting an integrated circuit (IC) die, and also to provide the IC die with an electrical interface to external circuitry, e.g., a printed circuit board, and a thermal interface to a surrounding environment. More particularly, electrical operations of the IC die generates heat, and as IC dies become smaller and better performing, a density of power consumption of the IC die increases. To prevent damage to the IC die, heat exchangers, such as heat spreaders, are used to transfer heat away from the IC die to the surrounding environment and/or external heat sinks.

DESCRIPTION OF EMBODIMENTS

Figure 1:
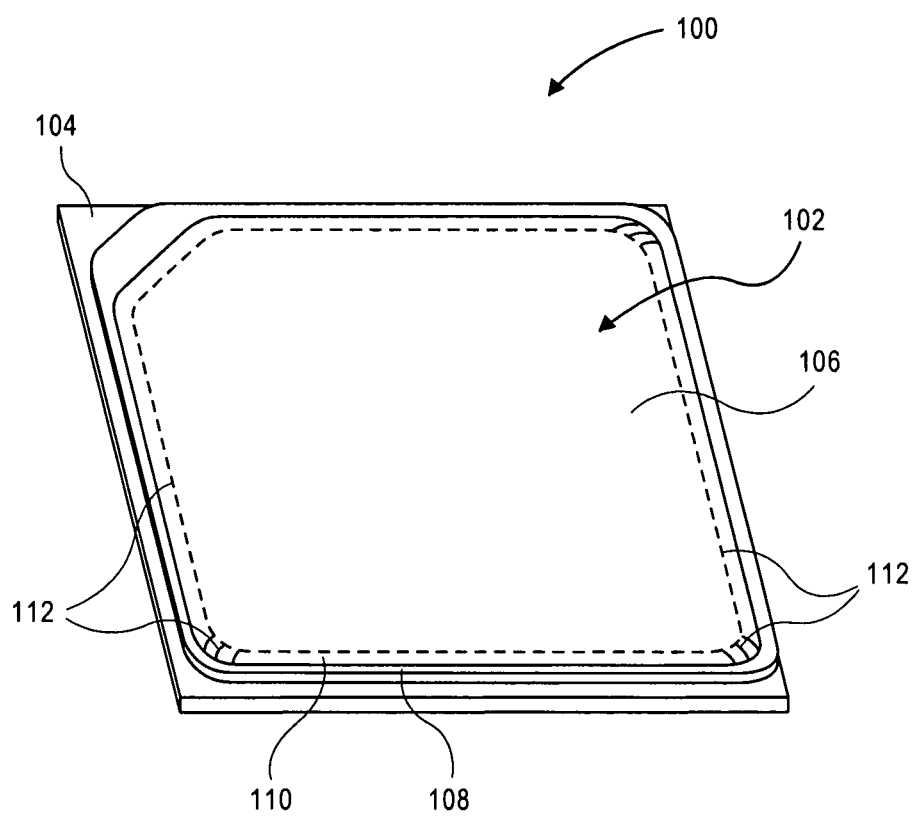
FIG. 1 illustrates a perspective view of a semiconductor package including an integrated heat spreader having an electromagnetically-formed top wall, in accordance with an embodiment.

Semiconductor packages including integrated heat spreaders having electromagnetically-formed features, are described. In the following description, numerous specific details are set forth, such as packaging and interconnect architectures, in order to provide a thorough understanding of embodiments of the present invention. It will be apparent to one skilled in the art that embodiments of the present invention may be practiced without these specific details. In other instances, well-known features, such as specific semiconductor fabrication processes, are not described in detail in order to not unnecessarily obscure embodiments of the present invention. Furthermore, it is to be understood that the various embodiments shown in the Figures are illustrative representations and are not necessarily drawn to scale.

Existing methods of manufacturing integrated heat spreaders include a cold stamping process used to mechanically deform a sheet of metal into a final integrated heat spreader shape. Deformation is achieved by pressing the sheet of metal against a die to bend and redistribute metal from the sheet form to the final shape. As the scale and complexity of integrated heat spreader geometries increase, however, differential work hardening caused by plastic deformation within the bulk material of the integrated heat spreader can cause warping of the heat spreader surface. For example, it has been discovered that cold stamping of integrated heat spreaders having large profiles, e.g., external profiles larger than 35 mm by 35 mm, and integrated heat spreaders having complex geometries, e.g., drastic thickness changes in the top plate to accommodate multiple dies and die cavities, tends to produce integrated heat spreader having non-flat top surfaces. For example, the top surfaces may include one or more undesirable concavities, e.g., bumps or depressions. Such non-flat features can increase a bond line thickness of a thermal interface material disposed between the integrated heat spreader and a corresponding heat sink in a microelectronics assembly. Thus, a non-uniform top profile and poor top flatness may cause poor thermal performance of a final product. Since such performance is unacceptable, integrated heat spreaders having non-flat top surfaces may be rejected at the manufacturing stage, resulting in reduced manufacturing yields and increased per part costs.

By way of further background, several methods for correcting a non-flat surface geometry of an integrated heat spreader have been proposed. For example, a conventional punch and die combination may be used to flatten the top surface. Such mechanical flattening, however, requires tonnage capacity of a stamping press, and existing stamping presses may not have spare tonnage, especially in the case of complex integrated heat spreader geometries that already stretch the limits of existing stamping press tonnage capabilities. Furthermore, such a solution may cause visible surface defects or increase localized surface hardening of the integrated heat spreader.

In an aspect, an integrated heat spreader may be formed by a method that utilizes electromagnetic force to plastically deform a top plate of the integrated heat spreader. The electromagnetically-formed top plate may therefore have a top flatness that meets design requirements and exhibits favorable thermal performance. In addition to producing effective integrated heat spreaders, the process may not consume additional press tonnage, and may flatten the top plate without introducing visible surface defects or localized surface hardening of the integrated heat spreader. Thus, methods of electromagnetically-forming features of an integrated heat spreader may be incorporated in existing manufacturing equipment to produce integrated heat spreaders having complex geometries, excellent top flatness, and effective thermal performance.

Referring to FIG. 1, a perspective view of a semiconductor package including an integrated heat spreader having an electromagnetically-formed top wall is illustrated in accordance with an embodiment. A semiconductor package 100 may contain one or more semiconductor electronic components, e.g., integrated circuit dies (not shown). The integrated circuit dies may be housed between an integrated heat spreader 102 and a package substrate 104. More particularly, semiconductor package 100 may include integrated heat spreader 102 mounted on package substrate 104 around the integrated circuit dies. A geometry of integrated heat spreader 102 may include a top wall 106 to transfer heat from the integrated circuit dies within semiconductor package 100 to an external or component. Top wall 106 may extend laterally and be surrounded by a perimeter 108, e.g., an outer edge of integrated heat spreader 102. More particularly, a side wall 110 may be contiguously connected to top wall 106 along a peripheral bend 112. That is, integrated heat spreader 102 may be formed from a flat sheet of material that is bent along peripheral bend 112 to form top wall 106 above the integrated circuit dies, side wall 110 laterally around the integrated circuit dies, and a physical connection between integrated heat spreader 102 and package substrate 104 along perimeter 108.

Figure 2:
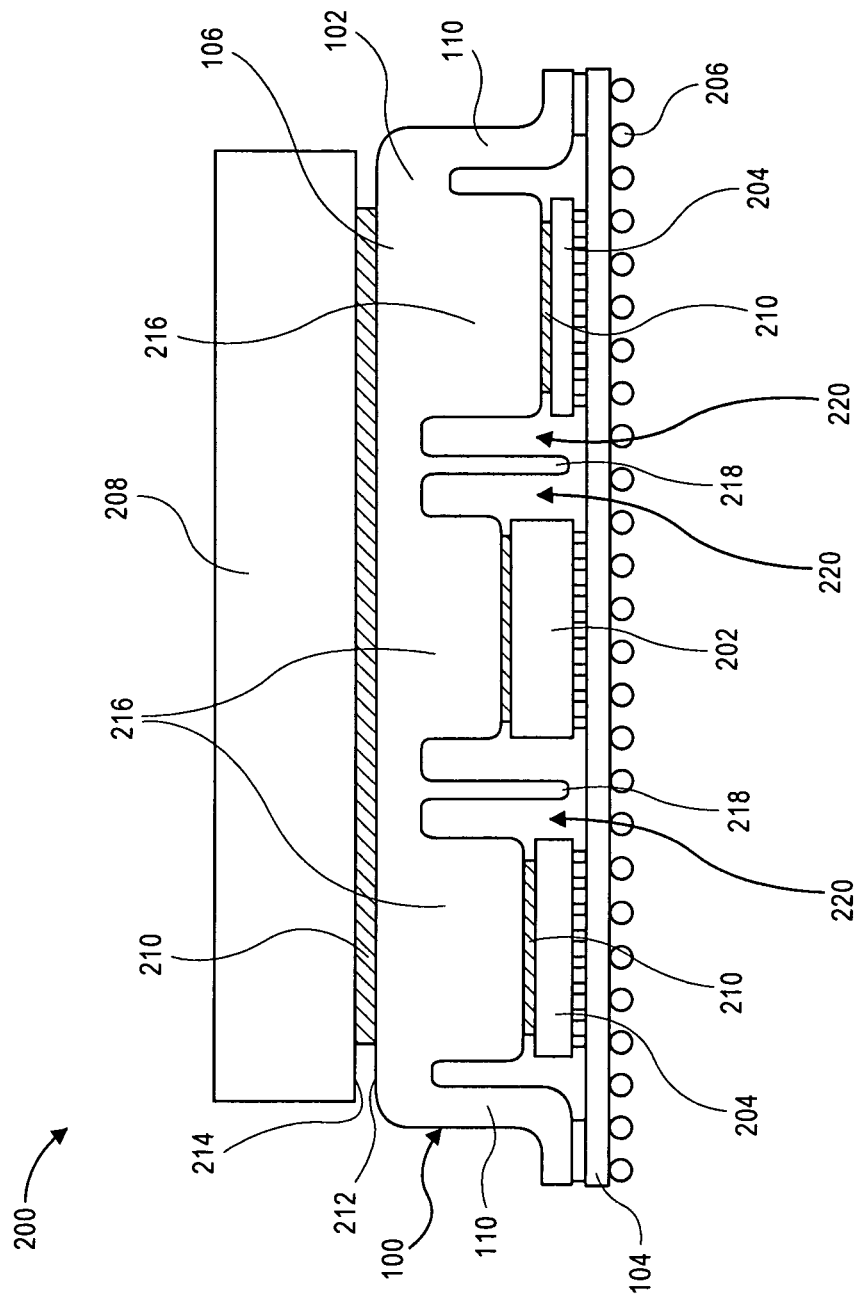
FIG. 2 illustrates a sectional view of a semiconductor package including an integrated heat spreader having an electromagnetically-formed top wall, in accordance with an embodiment.

Referring to FIG. 2, a sectional view of a semiconductor package including an integrated heat spreader having an electromagnetically-formed top wall is illustrated in accordance with an embodiment. Semiconductor package 100 may be incorporated in a microelectronics assembly 200, which may be part of an electronic device such as a computer system or a mobile phone. More particularly, semiconductor package 100 may be a multi-chip package, incorporating several integrated circuit dies used to perform various computing functions. By way of example, semiconductor package 100 may include a central processing unit (CPU) die 202 and one or more memory dies 204. Similarly, semiconductor package 100 may include one or more other chipsets, graphics devices, wireless devices, application-specific integrated circuits, etc. CPU die 202 and memory die 204 may be physically and electrically connected to package substrate 104 through respective interconnects, and package substrate 104 may be physically and electrically connected to an external printed circuit board (not shown) through contact pads 206. For example, contact pads 206 may be part of a ball grid array interconnection pin architecture. Thus, semiconductor package 100 may be incorporated in a computer system to perform various computing operations, and as a result, the integrated circuit dies 202, 204 of semiconductor package 100 may generate heat.

Integrated heat spreader 102 may be incorporated in microelectronics assembly 200 to transfer heat from CPU die 202 and/or memory die 204 to a heat sink 208. Accordingly, integrated heat spreader 102 may sit on top of the silicon dies and may be thermally connected to the dies by a thermal interface material 210. Thermal interface material 210 may be a paste that includes thermally conductive fillers. Thus, thermal interface material 210 may physically and thermally connect CPU die 202 and/or memory die 204 to integrated heat spreader 102. Likewise, thermal interface material 210 may be disposed between integrated heat spreader 102 and heat sink 208 to physically and thermally connect top wall 106 of integrated heat spreader 102 to heat sink 208. Although heat sink 208 is represented schematically as a block, it is to be understood that heat sink 208 may include one or more fins or other heat transfer features. More particularly, an electronic device housing microelectronics assembly 200 may include additional heat transfer components, such as forced air coolers, fans, thermoelectric coolers, etc., to remove heat from heat sink 208 and semiconductor package 100.

A bond line thickness, which may be defined as a distance between a top surface 212 of integrated heat spreader 102 and a bottom surface 214 of heat sink 208, may be critical to a thermal performance of microelectronics assembly 200. For example, as the bond line thickness increases, a volume of thermal interface material 210 between heat sink 208 an integrated heat spreader 102 also increases, which may result in an increased thermal resistance and limit a heat extraction efficiency of the heat transfer system. Accordingly, in an embodiment, an overall flatness of top surface 212 across a width of top wall 106 between side wall 110 on one side of integrated heat spreader 102 and side wall 110 on another side of integrated heat spreader 102 is less than 50 microns. Overall flatness may be defined as the distance between the two closest parallel planes encompassing top surface 212. Such flatness can be difficult to achieve in an integrated heat spreader 102 having the geometric complexities described below, however, in an embodiment, the integrated heat spreader 102 is advantageously formed using a method that plastically deforms top wall 106 using electromagnetic force to result in a desired flatness of top surface 212.

Integrated heat spreader 102 may include a complex geometry. For example, top wall 106 of integrated heat spreader 102 may include one or more pedestal 216 to make contact with underlying integrated circuit dies having different heights above package substrate 104. That is, pedestal 216 between memory die 204 and heat sink 208 may have a thickness that differs from a thickness of pedestal 216 between CPU die 202 and heat sink 208. Integrated heat spreader 102 may also include one or more cavities. For example, top wall 106 may include one or more cavity walls 218 extending from top surface 212 toward package substrate 104. A cavity 220 may be defined between cavity wall 218 and another cavity wall 218 and/or side wall 110 of integrated heat spreader 102. A first cavity 220 may house memory die 204 adjacent to a second cavity 220 that houses CPU die 202. The cavities may be separated from each other by the cavity walls 218. Thus, in addition to having a flat top surface 212, integrated heat spreader 102 may include a complex geometry having multiple cavities and/or multiple steps or thicknesses on a cavity-side of integrated heat spreader 102 between top surface 212 and package substrate 104 of microelectronics assembly 200.

Figure 3:
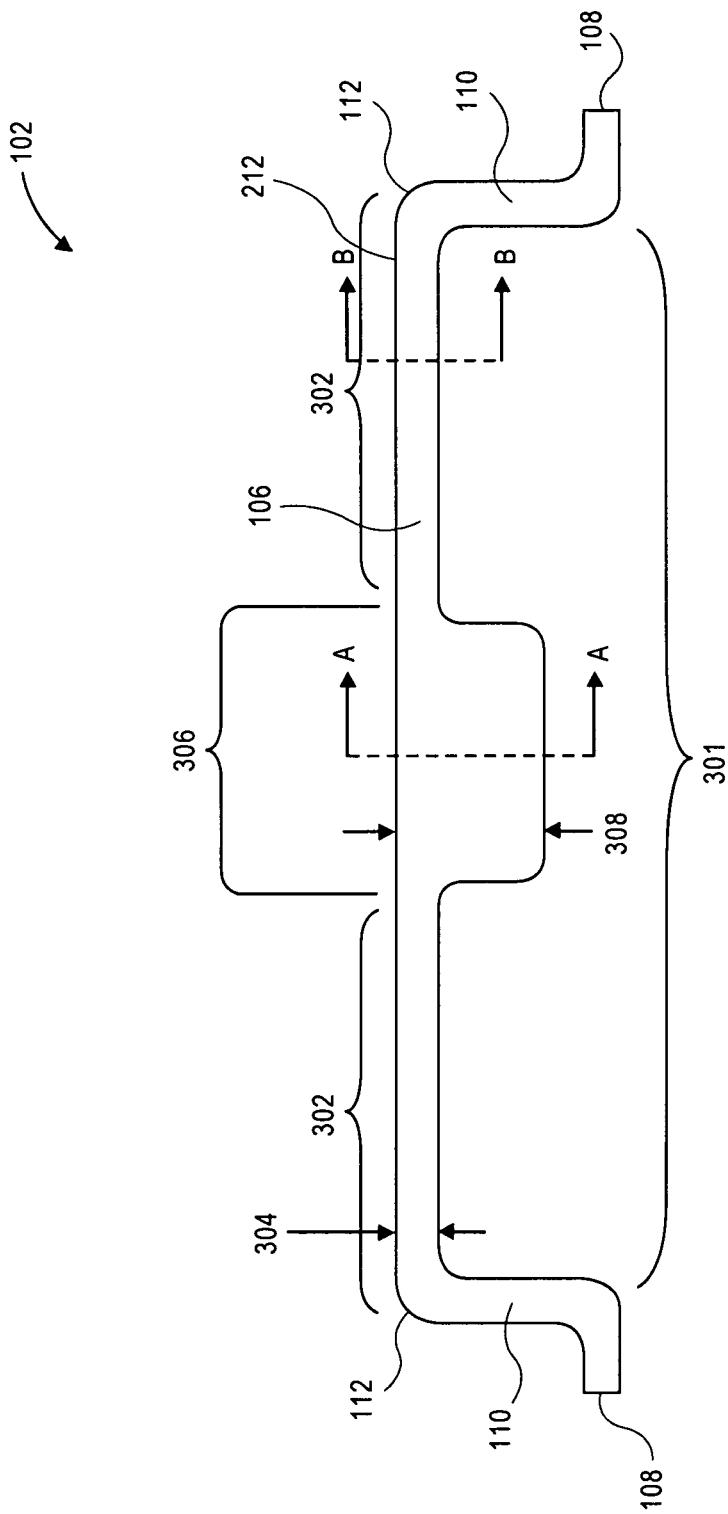
FIG. 3 illustrates a sectional view of an integrated heat spreader having an electromagnetically-formed top wall, in accordance with an embodiment.

Referring to FIG. 3, a sectional view of an integrated heat spreader having an electromagnetically-formed top wall is illustrated in accordance with an embodiment. The sectional geometry is provided by way of example, and may correspond to an integrated heat spreader 102 of any size or shape. For example, integrated heat spreader 102 may have a rectangular and/or polygonal profile, similar to that shown in FIG. 1. Alternatively, the integrated heat spreader profile may be circular, or another geometric shape. Top wall 106 may extend laterally between opposing side walls 110 over a width 301. Width 301 may be measured between side walls 110 and/or between opposing points on peripheral bend 112 connecting top wall 106 to side walls 110. In an embodiment, width 301 is at least 35 mm. For example, in the case of a rectangular integrated heat spreader profile, the profile may have width 301 and length dimensions corresponding to a square profile of at least 40 mm, i.e., a 40 mm by 40 mm top profile.

Integrated heat spreader 102 may have a complex geometry that includes top wall 106 having several thicknesses. In an embodiment, a first portion 302 of top wall 106 includes a first thickness 304 between top surface 212 and an underside of top wall 106. Similarly, a second portion 306 of top wall 106 may include a second thickness 308 between top surface 212 and the underside of top wall 106. Second portion 306 may correspond, for example, to pedestal 216 used to thermally connect to an underlying integrated circuit die. Thus, second thickness 308 may be at least 20% different than first thickness 304 such that pedestal 216 extends downward, essentially in contact with the integrated circuit die. Accordingly, first portion 302 of top wall 106 may be relatively thin compared to pedestal 216. By way of example, first portion 302 of integrated heat spreader 102 may have first thickness 304 of 200 microns, and second portion 306 may have second thickness 308 of 250 microns, i.e., 25% greater than first thickness 304. Each portion of top wall 106 may have a corresponding thickness of at least 200 microns, and a thickness variation of top wall 106 may be in a range of 50-300 microns between different portions.

In an embodiment, side wall 110 is between top wall 106 and perimeter 108. Side wall 110 may extend orthogonally downward from top wall 106 to another bent region where side wall 110 transitions into a flange. The flange may extend orthogonally outward from side wall 110 toward perimeter 108. Furthermore, the flange may be used to attach integrated heat spreader 102 to package substrate 104 using known bonding techniques.

Figure 4:
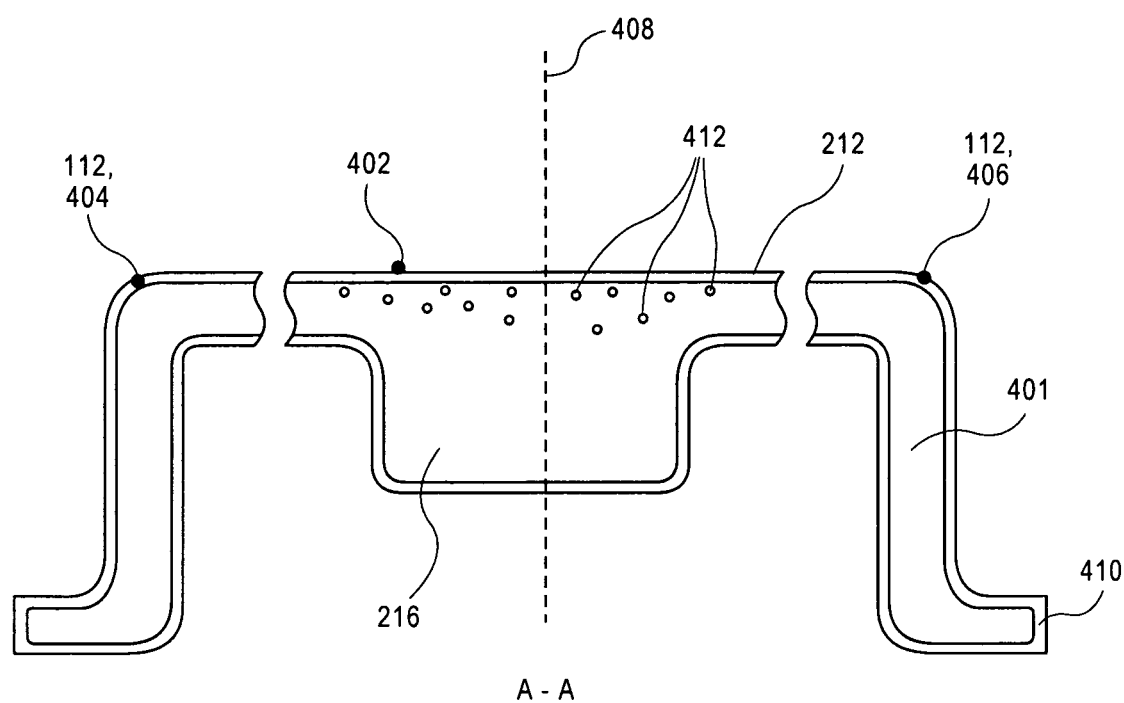
FIG. 4 illustrates a sectional view, taken about line A-A of FIG. 3, of a portion of an integrated heat spreader after being plastically deformed by an electromagnetic force, in accordance with an embodiment.

Referring to FIG. 4, a sectional view, taken about line A-A of FIG. 3, of a portion of an integrated heat spreader after being plastically deformed by an electromagnetic force is illustrated in accordance with an embodiment. As described below, integrated heat spreader 102 shown in FIG. 3 may be formed using a method that includes cold stamping and electromagnetic forming processes. An unintended consequence of cold stamping an integrated heat spreader 102 having the profile and thickness range described above is the formation of a non-flat feature in top wall 106, i.e., a sinking of top surface 212. For example, cold stamping may induce work hardening in a blank sheet of material used to form a copper core 401 of integrated heat spreader 102. As a result, work hardened material may store stresses that result in localize strains and cause macroscopic contours, e.g., a visible depression in top surface 212 of integrated heat spreader 102. Accordingly, after cold stamping the general shape of integrated heat spreader 102 shown in FIG. 3, a concavity may be present at an intermediate point 402 on top surface 212 between a first lateral point 404 on peripheral bend 112 and an opposing second lateral point 406 on peripheral bend 112. The concavity may have a height in a direction of a longitudinal axis 408, above or below a height of first lateral point 404 or second lateral point 406 relative to longitudinal axis 408. For example, the height of the concavity formed by cold stamping may be at least 50 microns, e.g., 60 microns. In an embodiment, the concavity may have a height of 100 microns or more. Accordingly, an overall flatness of top surface 212 may be at least the height of the concavity after cold stamping, e.g., at least 50 microns. As described above, however, integrated heat spreader 102 having the complex geometry shown in FIG. 3 may have a top flatness that is better than a top flatness achievable by conventional cold stamping processes. More particularly, the concavity may be removed from the bulk shape by an electromagnetic forming process.

Electromagnetic forming may be an explosive process, meaning that integrated heat spreader material may be plastically deformed quickly and have deformation rates that are much higher than those experienced during cold stamping. As a result, stored defects within the microstructure of integrated heat spreader 102 may differ between areas that have been deformed by electromagnetic forming and areas that have not. Copper core 401 of integrated heat spreader 102 may be surrounded by a nickel coating 410, e.g., nickel material added during a plating process. That is, integrated heat spreader 102 may include nickel coating 410 over copper core 401. Accordingly, differences in the microstructure of integrated heat spreader 102 may be evident in copper core 401, but not necessarily in nickel coating 410.

In an embodiment, a concavity may exist in top wall 106 after cold stamping in an area over pedestal 216. The pedestal 216 may be near a center of top wall 106, or may be located anywhere else within integrated heat spreader 102. Similarly, the concavity may not occur directly over a pedestal 216, and in an embodiment, the concavity in top wall 106 exists within first portion 302 of integrated heat spreader 102 having first thickness 304. In any case, when integrated heat spreader 102 is deformed by an electromagnetic forming process, the portion of top wall 106 having the concavity may be deformed against a die, e.g., a flat die. Deformation of the material of integrated heat spreader 102 may generate and store several microstructure dislocations 412 in top wall 106. In an embodiment, the portion of top wall 106 having the concavity, e.g., second portion 306, may include an average dislocation density. The average dislocation density may be a measure of the number of dislocations in a unit volume of top wall 106.

Figure 5:
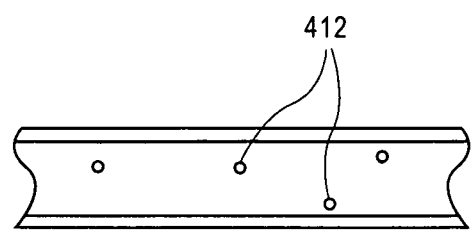
FIG. 5 illustrates a sectional view, taken about line B-B of FIG. 3, of a portion of an integrated heat spreader, the portion not being plastically deformed by an electromagnetic force, in accordance with an embodiment.

Referring to FIG. 5, a sectional view, taken about line B-B of FIG. 3, of a portion of an integrated heat spreader, the portion not plastically deformed by an electromagnetic force having an electromagnetically-formed top wall is illustrated in accordance with an embodiment. A portion of integrated heat spreader 102, e.g., first portion 302, may be laterally separated from the portion that initially included the concavity after cold stamping, e.g., second portion 306, and may also include several microstructure dislocations 412. For example, first portion 302 may include a same number of microstructure dislocations 412 as second portion 306 immediately after cold stamping. After electromagnetic forming, however, an average dislocation density of first portion 302 may be different from the average dislocation density of second portion 306. That is, first portion 302 may already be flat after cold stamping, and thus, may experience less plastic deformation during the electromagnetic forming operation than does second portion 306. Accordingly, the average dislocation density of first portion 302 may be less than the average dislocation density of second portion 306. As a result, an integrated heat spreader 102 formed by a method that includes an electromagnetic forming operation may have a top flatness that meets design requirements, and has microstructure dislocation densities that vary across top surface 212. More particularly, integrated heat spreaders 102 having electromagnetically-formed features may include microstructure dislocation densities that are unexpectedly high as compared to those formed by cold stamping processes, and such microstructure dislocations 412 may result from forming operations that preferentially deform portions of top wall 106 having concavities, after cold stamping as compared to portions not having cavities after cold stamping.

Figure 6:
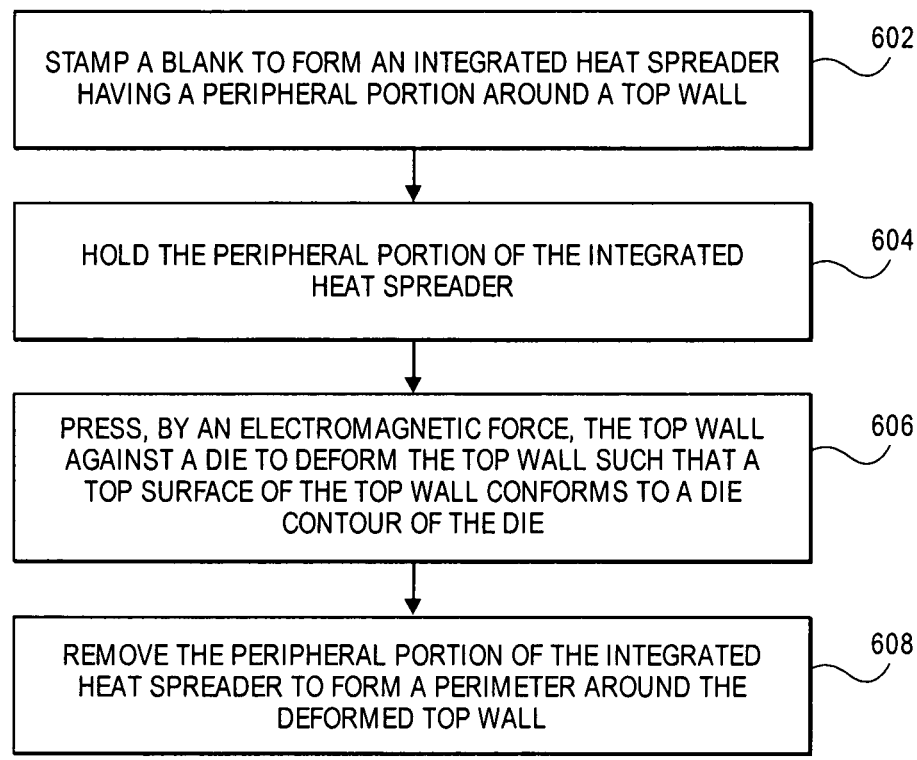
FIG. 6 illustrates a method of manufacturing an integrated heat spreader having an electromagnetically-formed top wall, in accordance with an embodiment.

Referring to FIG. 6, a method of manufacturing an integrated heat spreader having an electromagnetically-formed top wall is illustrated in accordance with an embodiment. FIGS. 7A-7E illustrate various operations in an embodiment of the method illustrated in FIG. 6. Thus, FIGS. 6 and 7A-7E are described in combination below.

Figure 7A:
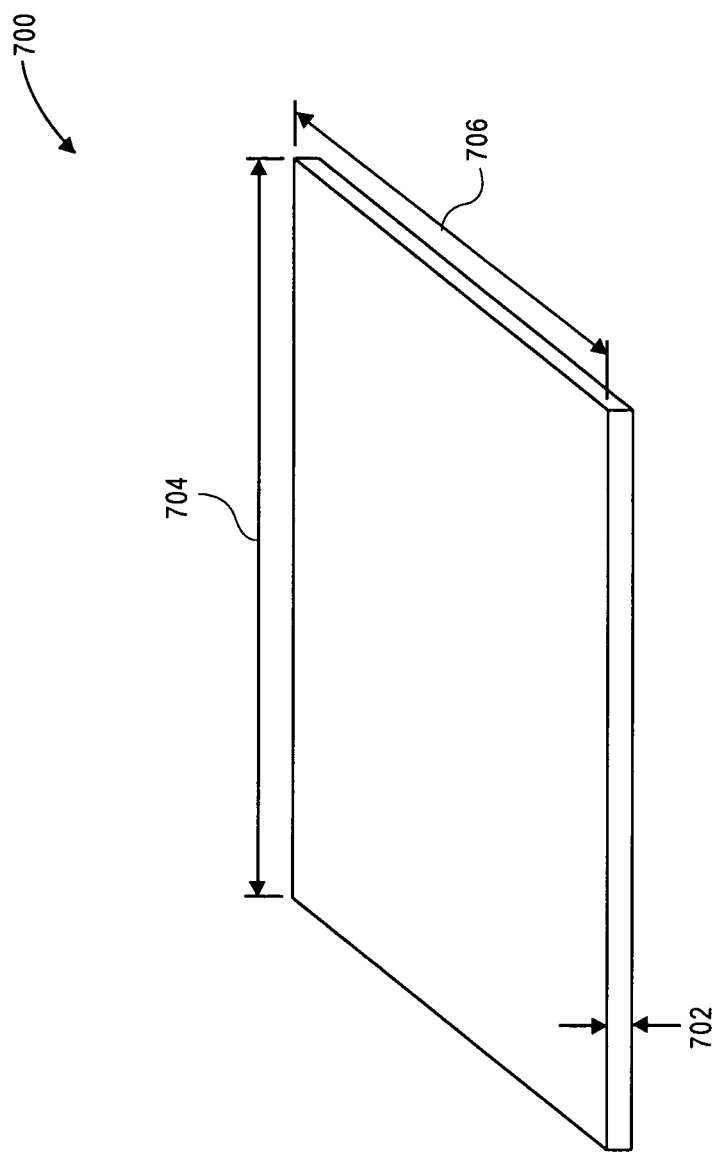
FIGS. 7A-7E illustrate various operations in a method of manufacturing an integrated heat spreader having an electromagnetically-formed top wall, in accordance with an embodiment.

At operation 602, a blank may be stamped to form a general shape of integrated heat spreader 102 having a peripheral portion around top wall 106. Referring to FIG. 7A, a blank 700 may include a metal sheet having a uniform sheet thickness 702. For example, the metal sheet may be a rectangular copper blank 700 having a sheet width 704 and a sheet length 706. Blank 700 may have an overall size that is approximately the same as integrated heat spreader 102 after cold stamping. Furthermore, the dimensions of blank 700 may correspond to dimensions of an integrated heat spreader 102 having an unconventionally large and complex geometry. For example, blank 700 may include a copper sheet having a uniform sheet thickness 702 of at least 4 millimeters, and having sheet width 704 and/or sheet length 706 of at least 40 millimeters. Although not shown, it will be understood that blank 700 may be formed in a blanking station of a stamping press, i.e., by a blanking operation.

Figure 7B:
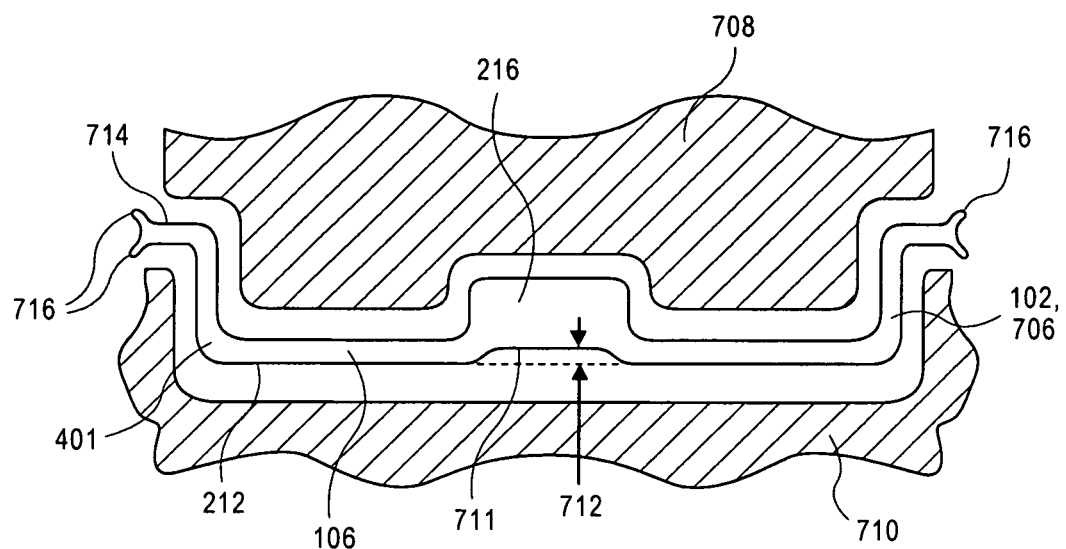

Referring to FIG. 7B, the stamping press may include several cold stamping stations. Each cold stamping station may include a punch 708 and a die 710 set up to deform blank 700 into the general shape of integrated heat spreader 102. That is, blank 700 may be inserted into several stations that sequentially stamp blank 700 to form integrated heat spreader 102 having copper core 401 with the desired contours, e.g., top wall 106, side walls 110, and flanges. The cold stamping operation may also deform blank 700 into integrated heat spreader 102 having one or more cavities, e.g., between cavity walls 218 (not shown), and one or more pedestals 216. After cold stamping, integrated heat spreader 102 may include top wall 106 having first portion 302 and second portion 306 that include respective thicknesses extending from top surface 212.

In addition to the desired contours, however, deformation of copper core 401 may cause copper to flow and produce unwanted contours as well. For example, cold stamping of integrated heat spreader 102 may result in a surface depression 711 in top surface 212. By way of example, surface depression 711 may be a concavity having a depression depth 712 of at least 10 microns in a direction orthogonal to top surface 212, e.g., in a direction of longitudinal axis 408.

The cold stamped integrated heat spreader 102 may include portions that will not be part of the final integrated heat spreader shape. For example, a peripheral portion 714 may extend around perimeter 108 of integrated heat spreader 102. Peripheral portion 714 may be a portion that is squeezed outward from blank 700 by punch 708 and die 710. As a result of the deformation process, peripheral portion 714 may include one or more burred edge 716. For example, a top edge or a bottom edge of peripheral portion 714 may include a sharp burr running around top wall 106.

Figure 7C:
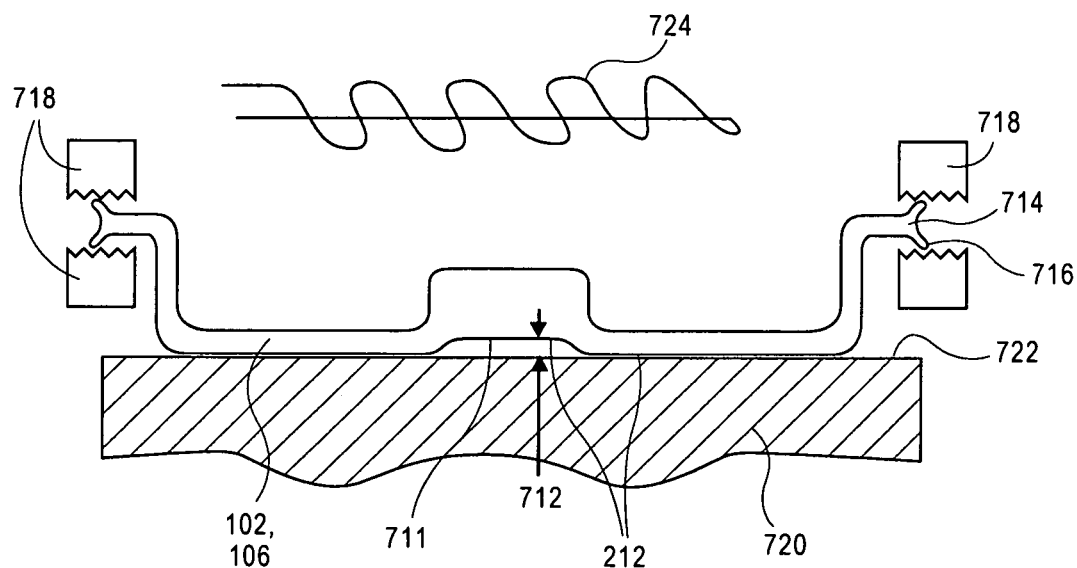

At operation 604, peripheral portion 714 of integrated heat spreader 102 may be held to facilitate further processing. Referring to FIG. 7C, a holding fixture 718 may grip peripheral portion 714, e.g., along burred edge 716, to maintain a position of integrated heat spreader 102 relative to other tooling in the stamping press. For example, holding fixture 718 may include one or more robotic arms, clamping devices, etc., to hold integrated heat spreader 102 while electromagnetically pressing top wall 106 against a forming die 720.

At operation 606, top wall 106 may be pressed against forming die 720 by an electromagnetic force 726 to deform top wall 106 such that top surface 212 conforms to a die contour 722 of forming die 720. The electromagnetic forming of top wall 106 may take place within an electromagnetic forming station incorporated in the stamping press. For example, stamping presses may include dummy stations that are ordinarily used for holding parts between sequential processes, and the electromagnetic forming station may replace one of these dummy stations. The electromagnetic forming station may include an electromagnetic coil 724 positioned over forming die 720. Accordingly, holding fixture 718 may move top surface 212 of integrated heat spreader 102 against forming die 720, between electromagnetic coil 724 and forming die 720. As such, first portion 302 of top wall 106 may be pressed against a surface of forming die 720 having die contour 722, while second portion 306 having underlying surface depression 711 may be separated from die contour 722 of the surface of forming die 720 by depression depth 712.

Figure 7D:
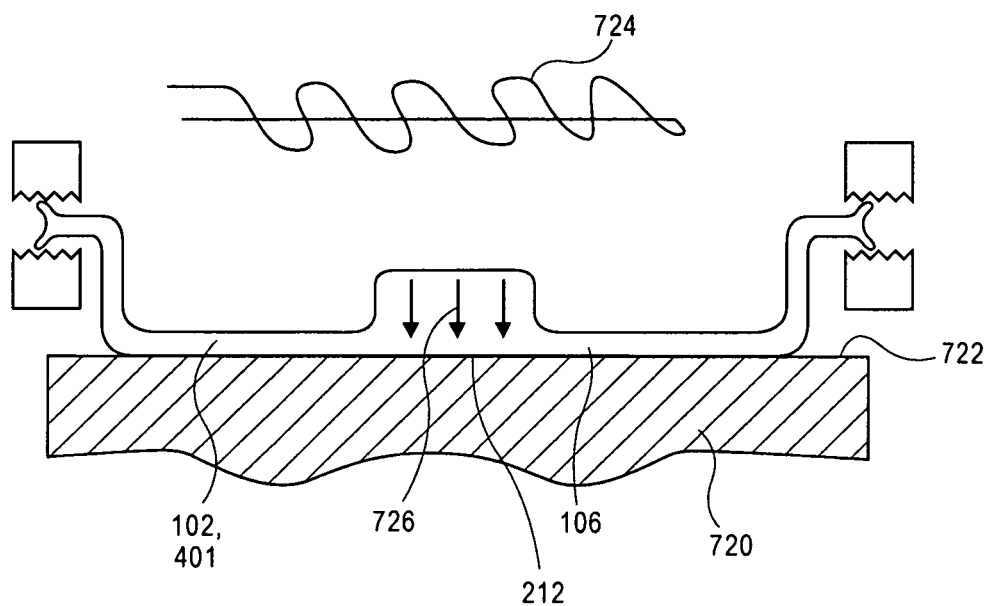
Figure 7E:
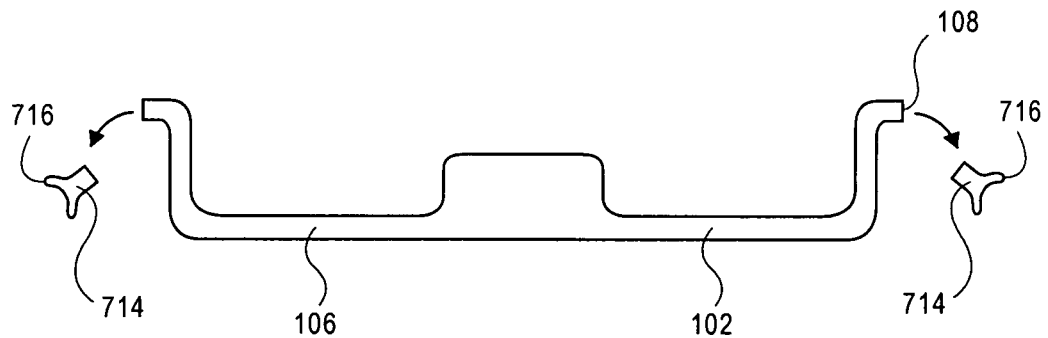

Referring to FIG. 7D, an electromagnetic force 726, e.g., a Lorentz force, may be generated by the electromagnetic forming station. For example, a capacitor bank (not shown) may be electrically connected to electromagnetic coil 724. The capacitor bank may be charged up and then discharged to send a large electrical surge through electromagnetic coil 724. The electrical surge may induce eddy currents within copper core 401 of integrated heat spreader 102. Since copper is highly electrically conductive, the induced eddy currents may generate a significant electromagnetic force 726 acting in a direction away from electromagnetic coil 724. That is, the electrical conductivity of copper may provide a higher pressure to electrical energy ratio during the electromagnetic forming operation, as compared to other materials. For example, electromagnetic force 726 may exert a pressure in excess of 300 MPa on top wall 106 of integrated heat spreader 102. Accordingly, electromagnetic force 726 may electromagnetically press top wall 106 against forming die 720, and deform top wall 106 such that top surface 212 conforms to die contour 722. More particularly, in a case where die contour 722 is a flat contour, a portion of top wall 106 may be plastically deformed outward to press top surface 212 along surface depression 711 against die contour 722. That is, electromagnetically pressing top wall 106 against forming die 720 may remove surface depression 711 from top surface 212. Thus, top wall 106 may be deformed to have top surface 212 exhibiting a predetermined overall flatness across width 301 of top wall 106. The overall flatness may be less after electromagnetically pressing top wall 106 against forming die 720 than before the electromagnetic forming operation. In an embodiment, the overall flatness is greater than 100 microns before electromagnetically pressing top wall 106 against forming die 720, and the overall flatness is less than 50 microns after electromagnetically pressing top wall 106 against forming die 720.

It will be appreciated that electromagnetically forming top wall 106 of integrated heat spreader 102 may include forming operations other than a flattening operation. For example, die contour 722 of forming die 720 may be curved or include one or more other non-flat features, e.g., ridges, bumps, etc. Accordingly, electromagnetic force 726 may be generated to plastically deform top wall 106 against such a non-flat die contour 722 to electromagnetically press top surface 212 into conformity with die contour 722, and thus, transfer a negative impression of the non-flat features into top wall 106.

At operation 608, peripheral portion 714 of integrated heat spreader 102 may be removed. For example, the additional material at the outer edge of integrated heat spreader 102 may be trimmed off. The trimming may take place in a trimming station of the stamping press. The trimming station may incorporate, for example, a punch and die setup configured to sheer peripheral portions 714 from the flange of integrated heat spreader 102. Alternatively, secondary cutting techniques, such as laser cutting, may be used to remove peripheral portions 714 from the flange. Thus, after holding peripheral portion 714 by holding fixture 718 during the electromagnetic deformation operation, the peripheral portion 714 may be removed (along with burred edge 716) from integrated heat spreader 102. A deburred perimeter 108 may thus be formed around the deformed top wall 106. Alternatively, a burr may remain on an edge of perimeter 108 after removing peripheral portion 714, and an additional burr removal operation may be incorporated to deburr perimeter 108.

The method of electromagnetically forming integrated heat spreader 102 described above may use electromagnetic force 726 to deform top wall 106 and to flatten top surface 212. It will be understood, however, that electromagnetic forming may be used to form other features of integrated heat spreader 102. For example, electromagnetic force 726 may be used to form a blunted edge around perimeter 108 of the flattened integrated heat spreader 102.

Figure 8:
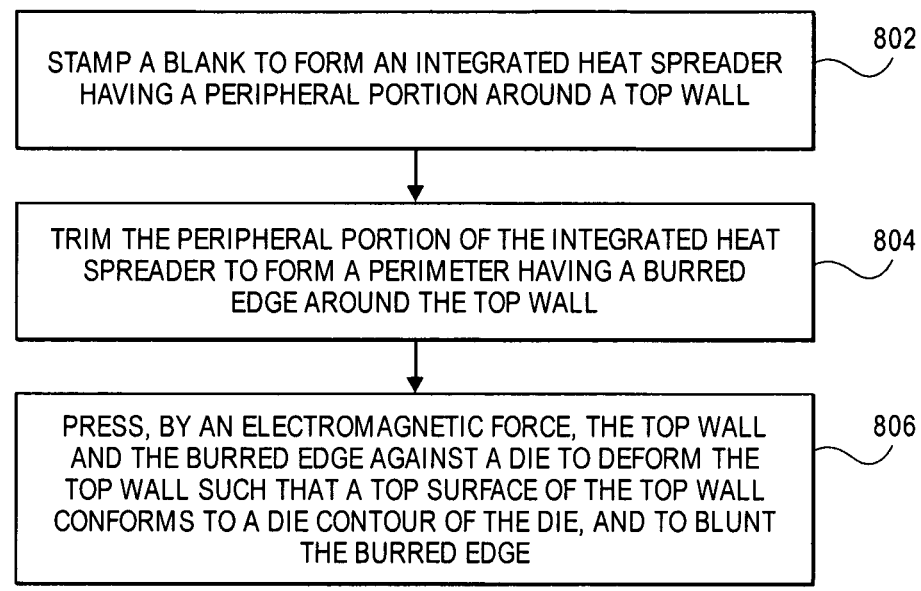
FIG. 8 illustrates a method of manufacturing an integrated heat spreader having an electromagnetically-formed top wall, in accordance with an embodiment.

Referring to FIG. 8, a method of manufacturing an integrated heat spreader having an electromagnetically-formed top wall is illustrated in accordance with an embodiment. FIGS. 9A-9D illustrate various operations in an embodiment of the method illustrated in FIG. 8. Thus, FIGS. 8 and 9A-9D are described in combination below.

Figure 9A:
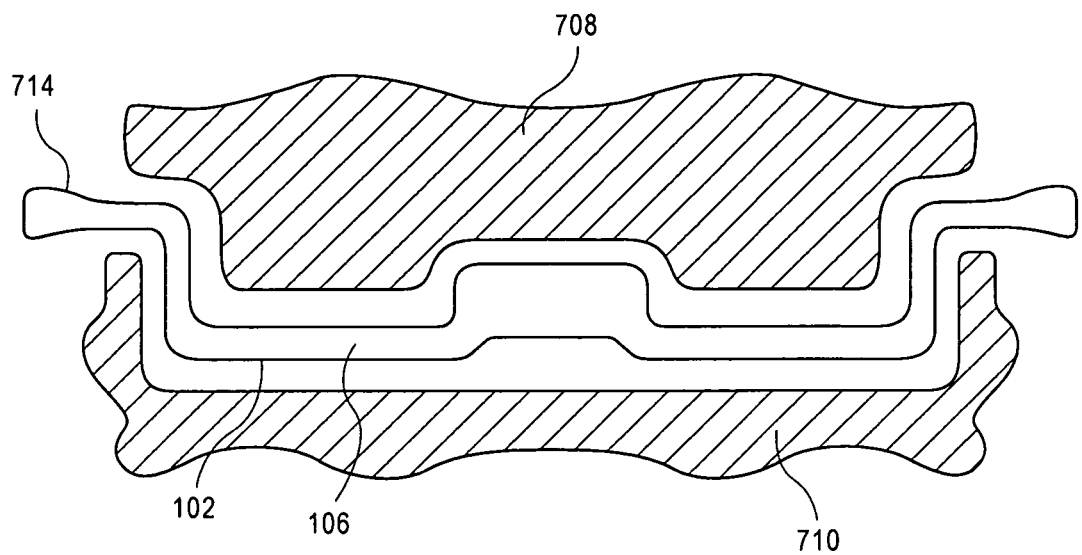
FIGS. 9A-9D illustrate various operations in a method of manufacturing an integrated heat spreader having an electromagnetically-formed top wall, in accordance with an embodiment.

At operation 802, blank 700 may be cold stamped to form integrated heat spreader 102. Referring to FIG. 9A, the method may include essentially the same techniques as described above with respect to FIGS. 6-7. Blank 700 may be deformed between one or more punch and die setup(s) to form integrated heat spreader 102 having top wall 106 including first portion 302 and second portion 306 having respective thicknesses. Additionally, integrated heat spreader 102 may include peripheral portion 714 around top wall 106. Here, peripheral portion 714 is illustrated as excess material extending outward from the flange of integrated heat spreader 102. Peripheral portion 714 may have rounded edges, or may include a burred edge, as described above.

Figure 9B:
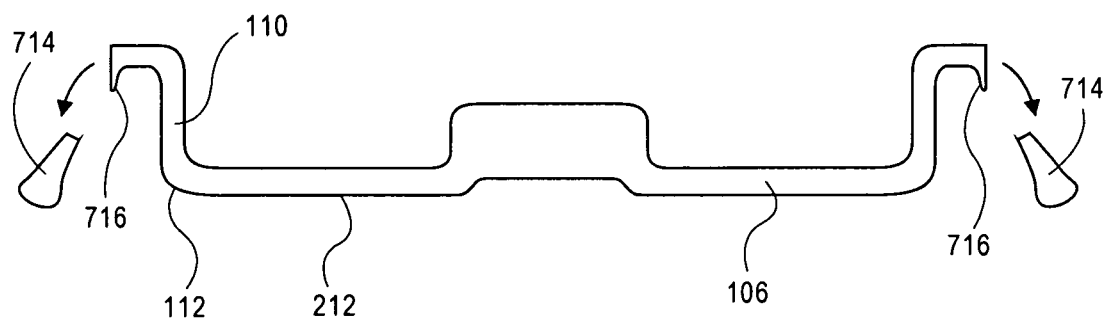

At operation 804, peripheral portion 714 may be trimmed to form perimeter 108. Referring to FIG. 9B, the trimming operation may occur prior to electromagnetically forming top wall 106. The trimming operation may be performed in a trimming station having a punch and die setup. In an embodiment, the trimming operation is designed in such a way that trimming peripheral portion 714 creates a standing burr on only one side of integrated heat spreader 102. More particularly, peripheral portion 714 may be removed, e.g., sheared from the flange of integrated heat spreader 102 such that burred edge 716 is deformed in a direction that creates a point or burr extending toward the side of integrated heat spreader 102 having top surface 212. Accordingly, burred edge 716 may extend around top wall 106. That is, top wall 106 may be contiguously connected to side wall 110 along peripheral bend 112, and side wall 110 may be between top wall 106 and burred edge 716 of perimeter 108.

Figure 9C:
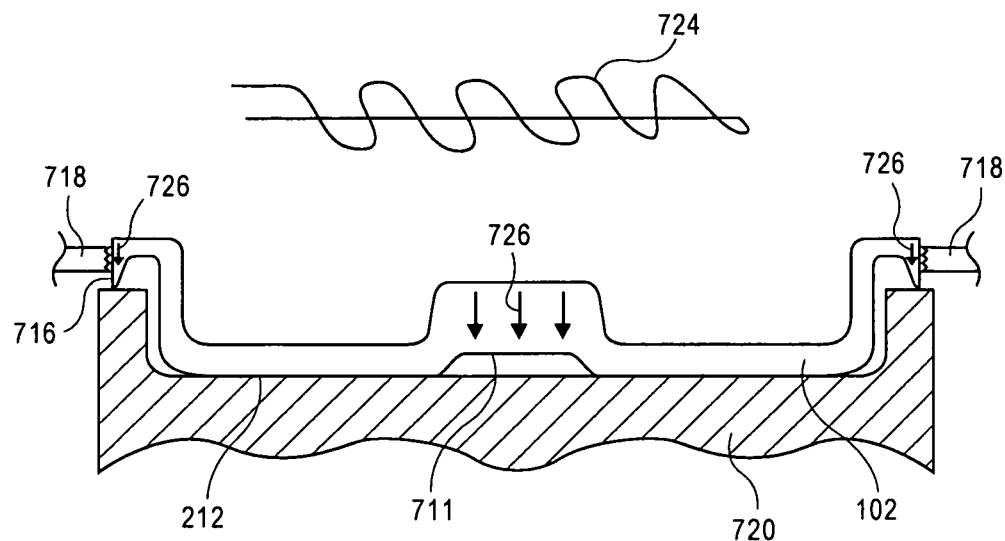

In an embodiment, top surface 212 and burred edge 716 may face a same direction such that both features may be pressed against forming die 720 to simultaneously flattened top surface 212 and remove burred edge 716. At operation 806, top wall 106 and burred edge 716 may be pressed against forming die 720 by electromagnetic force 726. Referring to FIG. 9C, the trimmed integrated heat spreader 102 may be placed with top surface 212 facing forming die 720. Likewise, burred edge 716 may be placed against forming die 720. In an embodiment, holding fixture 718 may include clamping jaws to press inward along perimeter 108 of integrated heat spreader 102 and to hold integrated heat spreader 102 in place.

As described above, a capacitor bank may be charged up and then discharged through electromagnetic coil 724 to generate electromagnetic force 726 in copper core 401 of integrated heat spreader 102. Electromagnetic force 726 may press integrated heat spreader 102 against forming die 720 to plastically deform non-flat regions, e.g., surface depression 711 and/or burred edge 716, against forming die 720.

Figure 9D:
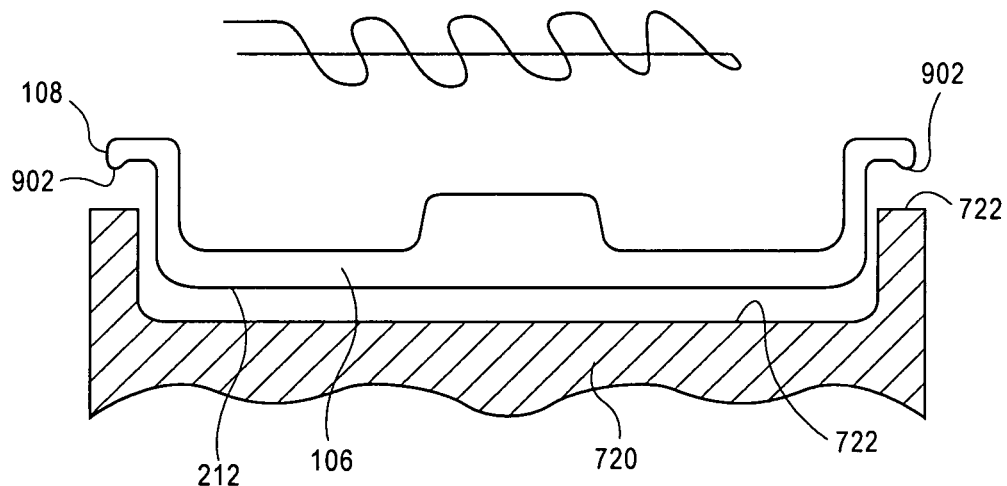

Referring to FIG. 9D, forming die 720 may include die contour 722, such that electromagnetically pressing top wall 106 against forming die 720 forms top wall 106 such that top surface 212 conforms to die contour 722. In an embodiment, electromagnetically pressing top wall 106 against forming die 720 flattens top surface 212. Similarly, electromagnetically pressing burred edge 716 against forming die 720 may blunt burred edge 716. More particularly, burred edge 716 may be deformed to create a blunted edge 902 running around top wall 106 along perimeter 108 of integrated heat spreader 102. Accordingly, perimeter 108 may include a blunt burred edge 902.

After forming an integrated heat spreader 102 into a predetermined shape, integrated heat spreader 102 may be nickel plated to form nickel coating 410 around copper core 401. Nickel plating after electromagnetic forming may prevent coating removal and unwanted surface marks on integrated heat spreader 102.

The methods of manufacturing an integrated heat spreader 102 described above may allow for superior top flatness to be achieved largely independent of a design complexity of the integrated heat spreader geometry. More particularly, the electro-magnetic forming process may allow for higher rates of deformation that lead to fewer material failures, e.g., due to excessive internal stresses, as compared to cold stamping. Thus, higher manufacturing yields may be achieved using electromagnetic forming as compared to existing cold stamping processes. Furthermore, the trend in semiconductor packages is toward larger cases, and the tonnage capability of existing stamping presses is already being stretched to capacity. Given that the electromagnetic forming process may not require stamping press tonnage (other than tonnage required to clamp integrated heat spreader 102 by holding fixture 718), the electromagnetic forming process may be incorporated within existing stamping presses to replace or supplement cold stamping operations. Accordingly, integrated heat spreaders having effective thermal performance may be formed by electromagnetic manufacturing methods that have high yields and integrate with existing stamping presses and techniques.

Figure 10:
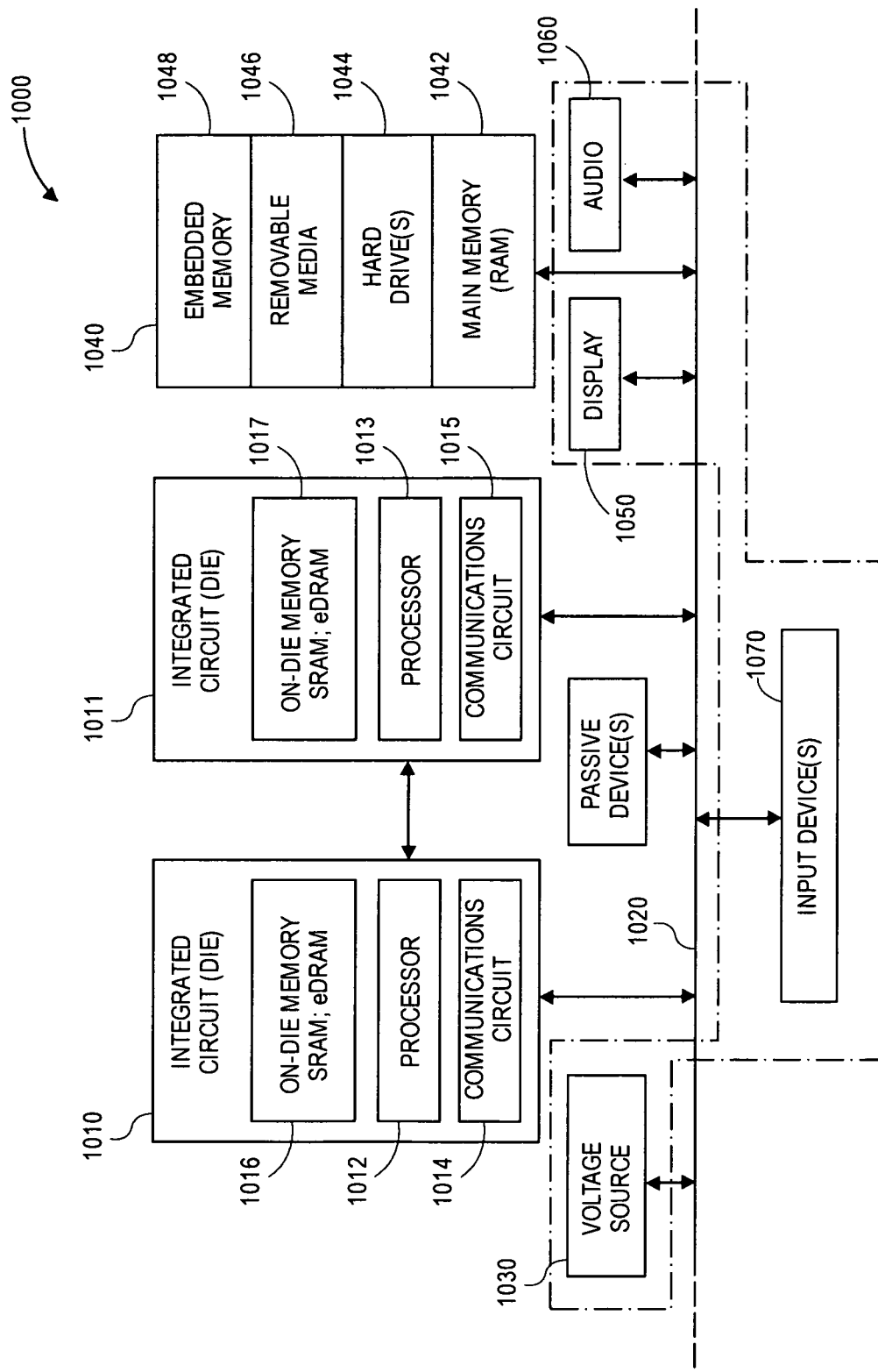
FIG. 10 is a schematic of a computer system, in accordance with an embodiment.

Referring to FIG. 10, a schematic of a computer system is illustrated in accordance with an embodiment. The computer system 1000 (also referred to as the electronic system 1000) as depicted can embody semiconductor packages including integrated heat spreaders having electromagnetically-formed features, according to any of the several disclosed embodiments and their equivalents as set forth in this disclosure. The computer system 1000 may be a mobile device such as a netbook computer. The computer system 1000 may be a mobile device such as a wireless smart phone. The computer system 1000 may be a desktop computer. The computer system 1000 may be a hand-held reader. The computer system 1000 may be a server system. The computer system 1000 may be a supercomputer or high-performance computing system.

In an embodiment, the electronic system 1000 is a computer system that includes a system bus 1020 to electrically couple the various components of the electronic system 1000. The system bus 1020 is a single bus or any combination of busses according to various embodiments. The electronic system 1000 includes a voltage source 1030 that provides power to the integrated circuit 1010. In some embodiments, the voltage source 1030 supplies current to the integrated circuit 1010 through the system bus 1020.

The integrated circuit 1010 is electrically coupled to the system bus 1020 and includes any circuit, or combination of circuits according to an embodiment. In an embodiment, the integrated circuit 1010 includes a processor 1012 that can be of any type. As used herein, the processor 1012 may mean any type of circuit such as, but not limited to, a microprocessor, a microcontroller, a graphics processor, a digital signal processor, or another processor. In an embodiment, the processor 1012 includes, or is coupled with, semiconductor packages including integrated heat spreaders having electromagnetically-formed features, as disclosed herein. In an embodiment, SRAM embodiments are found in memory caches of the processor. Other types of circuits that can be included in the integrated circuit 1010 are a custom circuit or an application-specific integrated circuit (ASIC), such as a communications circuit 1014 for use in wireless devices such as cellular telephones, smart phones, pagers, portable computers, two-way radios, and similar electronic systems, or a communications circuit for servers. In an embodiment, the integrated circuit 1010 includes on-die memory 1016 such as static random-access memory (SRAM). In an embodiment, the integrated circuit 1010 includes embedded on-die memory 1016 such as embedded dynamic random-access memory (eDRAM).

In an embodiment, the integrated circuit 1010 is complemented with a subsequent integrated circuit 1011. Useful embodiments include a dual processor 1013 and a dual communications circuit 1015 and dual on-die memory 1017 such as SRAM. In an embodiment, the dual integrated circuit 1011 includes embedded on-die memory 1017 such as eDRAM.

In an embodiment, the electronic system 1000 also includes an external memory 1040 that in turn may include one or more memory elements suitable to the particular application, such as a main memory 1042 in the form of RAM, one or more hard drives 1044, and/or one or more drives that handle removable media 1046, such as diskettes, compact disks (CDs), digital variable disks (DVDs), flash memory drives, and other removable media known in the art. The external memory 1040 may also be embedded memory 1048 such as the first die in a die stack, according to an embodiment.

In an embodiment, the electronic system 1000 also includes a display device 1050, and an audio output 1060. In an embodiment, the electronic system 1000 includes an input device such as a controller 1070 that may be a keyboard, mouse, trackball, game controller, microphone, voice-recognition device, or any other input device that inputs information into the electronic system 1000. In an embodiment, an input device 1070 is a camera. In an embodiment, an input device 1070 is a digital sound recorder. In an embodiment, an input device 1070 is a camera and a digital sound recorder.

As shown herein, the integrated circuit 1010 can be implemented in a number of different embodiments, including a semiconductor package including an integrated heat spreader having electromagnetically-formed features, according to any of the several disclosed embodiments and their equivalents, an electronic system, a computer system, one or more methods of fabricating an integrated circuit, and one or more methods of fabricating a semiconductor package including an integrated heat spreader having electromagnetically-formed features, according to any of the several disclosed embodiments as set forth herein in the various embodiments and their art-recognized equivalents. The elements, materials, geometries, dimensions, and sequence of operations can all be varied to suit particular I/O coupling requirements including array contact count, array contact configuration for a microelectronic die embedded in a processor mounting substrate according to any of the several disclosed semiconductor packages including integrated heat spreaders having electromagnetically-formed features embodiments and their equivalents. A foundation substrate may be included, as represented by the dashed line of FIG. 10. Passive devices may also be included, as is also depicted in FIG. 10.

In an embodiment, an integrated heat spreader includes a top wall including a first portion having a first thickness and a second portion having a second thickness at least 20% different than the first thickness. The top wall has a plurality of microstructure dislocations. An average dislocation density of the first portion is less than an average dislocation density of the second portion. A side wall is contiguously coupled to the top wall along a peripheral bend.

In one embodiment, an overall flatness of the top surface across a width of the top wall is less than 50 microns.

In one embodiment, the integrated heat spreader includes a nickel coating over a copper core. The width of the top wall is at least 35 mm. The first thickness and the second thickness are at least 200 microns.

In one embodiment, the side wall is between the top wall and a perimeter. The perimeter includes a blunt burred edge.

In an embodiment, a method of manufacturing an integrated heat spreader having an electromagnetically-formed top wall includes stamping a blank having a uniform sheet thickness to form an integrated heat spreader having a peripheral portion around a top wall. The top wall includes a first portion having a first thickness and a second portion having a different second thickness. The top wall has a top surface. The method includes pressing, by an electromagnetic force, the top wall against a die having a die contour. Electromagnetically pressing the top wall against the die deforms the top wall such that the top surface conforms to the die contour.

In one embodiment, the method includes holding the peripheral portion of the integrated heat spreader while electromagnetically pressing the top wall against the die.

In one embodiment, the method includes removing the peripheral portion of the integrated heat spreader to form a perimeter around the deformed top wall.

In one embodiment, the top surface includes a surface depression having a depression depth of at least 10 microns in a direction orthogonal to the top surface.

In one embodiment, electromagnetically pressing the top wall against the die removes the surface depression from the top surface.

In one embodiment, the top surface has an overall flatness across a width of the top wall. The overall flatness is less after electromagnetically pressing the top wall against the die.

In one embodiment, the overall flatness is greater than 100 microns before electromagnetically pressing the top wall against the die. The overall flatness is less than 50 microns after electromagnetically pressing the top wall against the die.

In one embodiment, the blank is a copper sheet having the uniform sheet thickness of at least 4 mm and having a sheet width of at least 40 mm.

In an embodiment, a method of manufacturing an integrated heat spreader having an electromagnetically-formed top wall includes stamping a blank having a uniform sheet thickness to form an integrated heat spreader having a peripheral portion around a top wall. The top wall includes a first portion having a first thickness and a second portion having a different second thickness. The top wall has a top surface. The method includes trimming the peripheral portion of the integrated heat spreader to form a perimeter having a burred edge around the top wall. The method includes pressing, by an electromagnetic force, the top wall and the burred edge against a die.

In one embodiment, the die includes a die contour. Electromagnetically pressing the top wall against the die deforms the top wall such that the top surface conforms to the die contour.

In one embodiment, electromagnetically pressing the top wall against the die flattens the top surface.

In one embodiment, the top surface has an overall flatness across a width of the top wall. The overall flatness is less after electromagnetically pressing the top wall against the die.

In one embodiment, the overall flatness is greater than 100 microns before electromagnetically pressing the top wall against the die. The overall flatness is less than 50 microns after electromagnetically pressing the top wall against the die.

In one embodiment, the top wall is contiguously coupled to a side wall along a peripheral bend. The side wall is between the top wall and the burred edge of the perimeter.

In one embodiment, electromagnetically pressing the burred edge against the die blunts the burred edge.

In one embodiment, the blank is a copper sheet having the uniform sheet thickness of at least 4 mm, and having a sheet width of at least 40 mm.

What is claimed is:

1. An integrated heat spreader, comprising:
    a top wall including a first portion having a first thickness and a second portion having a second thickness at least 20% greater than the first thickness, wherein the top wall has a plurality of microstructure dislocations, and wherein an average dislocation density of the first portion is less than an average dislocation density of the second portion; and
    a side wall contiguously coupled to the top wall along a peripheral bend.

2. The integrated heat spreader of claim 1, wherein an overall flatness of the top surface across a width of the top wall is less than 50 microns.

3. The integrated heat spreader of claim 2, wherein the integrated heat spreader includes a nickel coating over a copper core, wherein the width of the top wall is at least 35 mm, and wherein the first thickness and the second thickness are at least 200 microns.

4. The integrated heat spreader of claim 3, wherein the side wall is between the top wall and a perimeter, and wherein the perimeter includes a blunt burred edge.

* * * * *